(12) United States Patent
Akimoto et al.

(10) Patent No.: US 6,530,972 B2
(45) Date of Patent: Mar. 11, 2003

(54) METHOD FOR PREPARING METAL POWDER

(75) Inventors: Yuji Akimoto, Fukuoka (JP); Kazuro Nagashima, Ohnojo (JP); Hiroshi Yoshida, Ohnojo (JP); Hirotaka Takushima, Kurume (JP); Masayuki Maekawa, Sasaguri-machi (JP)

(73) Assignee: Shoei Chemical Inc., Tokyo (JP)

( * ) Notice: Subject to any disclaimer, the term of this patent is extended or adjusted under 35 U.S.C. 154(b) by 0 days.

(21) Appl. No.: 09/836,766

(22) Filed: Apr. 17, 2001

(65) Prior Publication Data

US 2002/0000137 A1 Jan. 3, 2002

(30) Foreign Application Priority Data

May 2, 2000 (JP) ........................................ 2000-133576

(51) Int. Cl.$^7$ .................................................. B22F 9/20
(52) U.S. Cl. .............................. 75/351; 75/362; 75/369
(58) Field of Search ........................... 75/351, 362, 369

(56) References Cited

U.S. PATENT DOCUMENTS

| | | | | |
|---|---|---|---|---|
| 4,810,285 A | * | 3/1989 | Otsuka et al. ................. 75/369 |
| 5,421,854 A | * | 6/1995 | Kodas et al. .................. 75/369 |
| 5,429,657 A | * | 7/1995 | Glicksman et al. ............ 75/351 |
| 5,439,502 A | * | 8/1995 | Kodas et al. .................. 75/369 |
| 5,853,451 A | * | 12/1998 | Ishikawa ...................... 75/369 |
| 5,928,405 A | * | 7/1999 | Ranade et al. ................ 75/351 |
| 5,964,918 A | * | 10/1999 | Asada et al. .................. 75/351 |
| 5,976,217 A | | 11/1999 | Kneringer et al. ............ 75/353 |
| 6,090,179 A | * | 7/2000 | Rosenband et al. ........... 75/362 |
| 6,159,267 A | * | 12/2000 | Hampden-Smith et al. ... 75/351 |

FOREIGN PATENT DOCUMENTS

| | | |
|---|---|---|
| JP | 36-9163 | 6/1961 |
| JP | 63-31522 | 6/1988 |

* cited by examiner

*Primary Examiner*—George Wyszomierski
(74) *Attorney, Agent, or Firm*—Flynn, Thiel, Boutell & Tanis, P.C.

(57) ABSTRACT

A method for preparing a highly crystallized metal powder, involving the steps of: supplying at least one heat-decomposable metal compound powder into a reaction vessel using a carrier gas; and forming a metal powder by heating the metal compound powder in a state in which the metal compound powder is dispersed in a gas phase at a concentration of no more than 10 g/liter, at a temperature that is over the decomposition temperature of the metal compound powder and at least (Tm −200)° C. when the melting point of the metal contained in the metal compound powder is Tm° C. The method provides a high-purity, high-density, highly dispersible, fine, highly crystallized metal powder consisting of spherical particles of uniform size, which is suitable for use in thick film pastes, and particularly conductor pastes and the like used in the preparation of multilayer ceramic electronic parts.

6 Claims, No Drawings

METHOD FOR PREPARING METAL POWDER

BACKGROUND OF THE INVENTION

1. Field of the Invention

The present invention relates to a method for preparing a metal powder suited for use in electronics, and more particularly to a method for preparing a highly crystallized metal powder that is useful as a conductive powder for use in a conductor paste.

2. Description of the Related Art

A conductive metal powder used in a conductor paste for forming an electronic circuit should contain minimum impurities, be a fine powder (with an average particle size from no more than 0.1 µm to about 10 µm), have a uniform particle shape and size, and consist of monodispersed particles with no aggregation. This powder is also required to disperse well in a paste, and have good enough crystallinity that it will not sinter unevenly. In particular, when the powder is used to form an internal or external conductor for a multilayer ceramic electronic part, such as a multilayer capacitor or multilayer inductor, it is required to be a fine spherical, low activity, high crystallinity or single-crystal metal powder which is insusceptible to expansion or shrinking due to oxidation and reduction during firing and high sintering commencement temperature, and which consists of submicron particles having a finely uniform shape and particle size, in order to prevent delamination, cracks and other structural defects and enable the reduction of the film thickness of a conductor.

Specifically, a multilayer ceramic electronic part is generally prepared by alternately laminating a plurality of unfired ceramic green sheet layers of a dielectric material, a magnetic material or the like, and internal conductor paste layers comprising as a conductive component a powder of a noble metal such as palladium or silver-palladium, or a powder of a base metal such as nickel or copper, and co-firing the laminated layers at a high temperature. When a base metal that is susceptible to oxidation is used for the internal conductor, various problems are encountered. For instance, in the case of using nickel powder as the conductive component in the internal conductor paste, the laminated body is heated in an oxidizing atmosphere up to the binder removal step that is usually carried out at a temperature of about 300 to 600° C., so that the organic vehicle in the paste and the ceramic green sheets has been completely burned off. During this organic removal step, nickel is slightly oxidized. Then, firing is performed in an inert atmosphere or a reducing atmosphere, and a reduction treatment is performed if needed. However, since completely reducing nickel powder that has been oxidized in the binder removal step is very difficult, deterioration in electrical characteristics, such as an increase in resistance results. Also, the oxidation and reduction are accompanied by volumetric expansion and shrinkage of the electrodes. Because these volumetric changes do not coincide with the sintering shrinkage behavior of the ceramic layer, delamination, cracking, and other such structural defects are apt to occur. Furthermore, a nickel powder quickly sinters in a non-oxidizing atmosphere, and provides a discontinuous film of internal conductor due to its oversintering, thereby causing problems such as an increased resistivity or internal disruption and resulting in an increased conductor thickness, which is contrary to the need for a reduction in thickness of internal conductor layers made along with an increase in the number of laminated layers in recent years. The above oxidation and oversintering have also caused similar problems in the case where an external conductor is formed by co-firing using a nickel paste. Therefore, there is a need for a highly crystallized nickel powder that is resistant to oxidation, at least during binder removal, and has a high sintering commencement temperature.

Meanwhile, palladium, which is a noble metal, has a property that it is oxidized at a relatively low temperature during firing, and is reduced when further heated to a higher temperature, and this leads to structural defects caused due to disagreement in sintering and shrinking behavior between the conductor layer and the ceramic layer. Therefore, oxidation resistance is desirable with palladium and palladium alloys as well, and in this respect a spherical, highly crystallized powder is superior, with a single-crystal powder being particularly good.

Spray pyrolysis has heretofore been known as a conventional method for preparing a well-crystallized metal powder such as this. As discussed in Japanese Patent Publication 63-31522 and elsewhere, spray pyrolysis is a method in which a solution containing one or more metal compounds, or a suspension in which these compounds have been dispersed, is sprayed in the form of fine droplets, and these droplets are heated at a temperature higher than the decomposition temperature of the metal compounds, and preferably a temperature near or above the melting points of the metals contained in the metal compounds, so that the metal compounds are pyrolyzed and metal or alloy powder is precipitated. This method yields a highly crystallized or single-crystal, high-density, highly dispersible, true-spherical metal powder or alloy powder. Unlike a wet-type reducing method, preparation is easy because there is no need for solid-liquid separation, and since no additives or solvents that would affect the purity of the product are used, an advantage is that a high-purity powder containing no impurities is obtained. Furthermore, it is easy to control the particle size, and since the composition of the produced particles is basically the same as the composition of the starting metal compounds in the solution, it is also easy to control the composition of the produced particles.

A problem encountered with this method, however, is that because water or an organic solvent such as alcohol, acetone, or ether is used as a dispersion medium or solvent for making droplets out of the metal compound raw material, there is considerable energy loss during pyrolysis, and the cost is high. Specifically, in this method, pyrolysis of the metal compound is carried out simultaneously with the evaporation of the solvent by heating, or pyrolysis of the metal compound is carried out after the evaporation of the solvent, but in either case a tremendous amount of energy is needed to evaporate the solvent. Also, the droplets are subjected to aggregation or disruption inside the reaction vessel, which results in a broad particle size distribution in the resulting powder. This makes it difficult to set the spray velocity, the droplet concentration in the carrier gas, the dwelling time in the reaction vessel, and the reaction conditions. Particularly, with a powder of a base metal such as nickel, iron, cobalt, or copper, the pyrolysis must be conducted in a carefully controlled reducing or weakly reducing atmosphere in order to prevent oxidation. Furthermore, when water is used as a solvent, oxidation tends to occur a at high temperature because of the oxidizing gas produced by the decomposition of the water, and this makes it difficult to obtain a powder with good crystallinity.

A method for preparing metal ultra fine particles by a vapor phase process is also well known. For instance, to obtain a nickel powder, nickel chloride is vaporized and then reduced by a reducing gas at a high temperature. However, a powder obtained by a precipitation reaction from the vapor phase is prone to aggregation, and furthermore it is difficult to control its particle size. It is also impossible to produce an alloy of metals with different vaporization pressures in an accurately controlled composition.

U.S. Pat. No. 5,976,217 discloses a method for reducing a metal compound powder, such as tungsten oxide powder, by a solid-gas reaction using a reducing agent. This method comprises introducing a metal compound powder material along with a reducing gas and, optionally, a carrier gas into a heated reaction chamber, and passing them through the chamber along predetermined paths, wherein the material is subjected to chemical reduction. The reduction of the material to be reduced is caused by contact with the reducing gas. Therefore, when the material is provided in a solid powder state, the contact area between the material and the reducing gas is small as compared with the above-mentioned vapor phase process and therefore it is difficult to complete the reduction of the powdered material to metal in a short time. Even if a cyclone is used to ensure a longer path or cause explosion of the material particles, unreacted or incompletely reduced material still remains, making it difficult to set the suitable processing parameters (e.g., the traveling path, the way of feeding the reducing gas, etc.). Further, in this patent there is no mention about obtaining a uniform spherical metal powder with a good crystallinity suitable for use in electronics.

Japanese Patent Publication 36-9163 discloses a method for preparing a high-purity metal powder or mixture thereof by pyrolyzing a silver, nickel, or copper salt of an organic polybasic acid in air or an inert gas at a relatively low temperature, namely, 100 to 500° C., and also states that a fine metal powder with a particle size of just a few microns or less can be obtained by grinding. With this method, though, not only is it impossible to control the particle size precisely, but if the material is heated to close to or over the melting point of the metal in an effort to raise crystallinity, the particle shape cannot be maintained, and the particle size cannot be brought to just a few microns or less by grinding.

SUMMARY OF THE INVENTION

It is an object of the present invention to obtain a high-purity, high-density, highly dispersible, fine, highly crystallized metal powder consisting of spherical particles of uniform size, which is suited for use in thick film pastes, and particularly, conductor pastes and the like used in the preparation of multilayer ceramic electronic parts. It is another object of the present invention to provide a novel method for preparing a metal powder such as this by a low-cost and simple procedure.

Specifically, the present invention resides in a method for preparing a highly crystallized metal powder, comprising:

supplying at least one heat-decomposable metal compound powder into a reaction vessel using a carrier gas; and forming a metal powder by heating the metal compound powder in a state in which the metal compound powder is dispersed in the gas phase at a concentration of no more than 10 g/liter, at a temperature that is over the decomposition temperature of the metal compound powder and at least (Tm −200)° C. when the melting point of the metal contained in the metal compound powder is Tm° C.

The present invention also resides in the above-mentioned method for preparing a highly crystallized metal powder, wherein the metal compound powder is a homogeneous mixed powder or a composite powder of a metal compound or compounds including two or more metal elements, and the metal powder is an alloy powder.

The present invention also resides in a highly crystallized metal powder prepared by the above-mentioned method, a conductor paste including this highly crystallized metal powder, and a multilayer ceramic electronic part in which a conductor layer is formed using the above-mentioned conductor paste.

DESCRIPTION OF THE PREFERRED EMBODIMENTS

There are no particular restrictions on the metal powder prepared with this method, but this method is particularly well suited to the preparation of a powder of a base metal such as copper, nickel, cobalt, or iron, or of a noble metal powder such as silver, palladium, gold, or platinum. A mixed powder or alloy powder comprising a plurality of metals can be obtained through appropriate selection of the raw material metal compound powder or powders. The term "metal powder" as used in the present invention encompasses these mixed powders and alloy powders.

The heat-decomposable metal compound powder used as the raw material of the metal powder can be an inorganic compound, such as a hydroxide, nitrate, sulfate, carbonate, oxynitrate, oxysulfate, chloride, oxide, ammonium complex, or phosphate, or it can be an organic compound, such as a carboxylate, resinate, sulfonate, acetylacetonate, or metal mono- or polyhydric alcoholate. A hydroxide, carbonate, carboxylate, resinate, acetylacetonate, alcoholate, or the like is preferable here because there will be no harmful by-products after pyrolysis.

A mixture of two or more metal compound powders can also be used as the raw material powder.

When an alloy powder is prepared, raw material powders for the alloy component metals may simply be uniformly mixed in the required compositional ratio, but it is preferable to use a composite powder in which a plurality of metal components have already been compounded so as to be included in the specified compositional ratio in each particle of the raw material powder. This compounding can be accomplished by a method in which the metal compound powders that serve as the raw materials are mixed ahead of time, and then heat treated until the composition is uniform, and then pulverized, or a known method such as a sol-gel method or co-precipitation method. A double salt, complex salt, metal double oxide, or the like may also be used.

In the method of this invention, it is assumed that one metal or alloy particle is formed from one particle of the raw material heat-decomposable metal compound. Therefore, the size of the resulting metal particles is substantially proportional to the particle size of the raw material powder although the proportion thereof depends on the kind of the metal compound. Therefore, to obtain a metal powder with a uniform particle size, a metal compound powder with a uniform particle size is used. If the particle size distribution of the raw material powder is wide, it is preferable to adjust the particle size by pulverization, grinding, or classification with a pulverizer or classifier prior to dispersing the material powder in the gas phase.

It is important in the present invention that the solid metal compound powder be pyrolyzed in a state of being dispersed in the gas phase. Furthermore, inside the reaction vessel, the raw material powder must be pyrolyzed in a state of being dispersed at a concentration low enough that particles of the raw material powder and particles of the product powder do not collide with each other. Accordingly, the concentration of the metal compound in the gas phase must be 10 g/liter or less. If the concentration is above this, collisions between the particles will prevent a metal powder with a uniform particle size from being obtained. The dispersion concentration may be appropriately determined depending on the type of the dispersing device or the pyrolyzing device. There are no particular restrictions on the concentration, as long as it is 10 g/liter or less. However, if the metal compound concentration is too low in the gas phase, production efficiency will also be low. Therefore, at least 0.01 g/liter is usually preferable.

There are no particular restrictions on the means for dispersing the raw material powder in the gas phase, and any ordinary dispersing device can be used. In order to conduct the pyrolysis while maintaining the above-mentioned low concentration dispersion state, for example, a tubular reaction vessel heated from the outside is used, the raw material powder is supplied from one opening along with a carrier gas at a constant flow rate and made to pass through the reaction vessel, and the metal powder produced by pyrolysis is recovered at the other opening. The flow rate of a mixture of the raw material powder and the carrier gas and the time for the mixture to pass through the reaction vessel is set depending on the devices used so that the powder will be fully heated at the desired temperature. The heating may be from the outside of the reaction vessel, using an electric furnace, gas furnace, or the like, or a fuel gas may be supplied to the reaction vessel to use the combustion flame thereof.

In the case of preparing a noble metal powder, there are no particular restrictions on the carrier gas, and an oxidizing gas (e.g., air, oxygen, water vapor, etc.), an inert gas (e.g., nitrogen, argon, etc.), or a mixture of these can be used. In the case of preparing a base metal such as nickel or copper, which is susceptible to oxidation, an inert gas is used and such an inert gas may be used in combination with a reducing gas, such as hydrogen, carbon monoxide, or methane, in order to carry out the pyrolysis in a somewhat reducing atmosphere and to thereby effectively prevent the oxidation of the metal powder.

One of the characteristics of the present invention is that there is no need for precise adjustment of the atmosphere during heating. Especially, in the case of a base metal, if the raw material is a metal compound capable of producing carbon monoxide, hydrogen, methane, or the like when pyrolyzed in an inert gas, and thereby creating a reducing atmosphere, then a metal powder with almost no oxidation will be obtained without any need to supply a reducing gas from the outside to the reaction system. For example, when a nickel powder is prepared by conventional spray pyrolysis using an aqueous solution, a reducing gas usually must be introduced in a precisely controlled amount in order to prevent the oxidation of the nickel. With the method of the present invention, however, when nickel acetate or another carboxylate powder is used for the raw material and pyrolysis is conducted in a nitrogen atmosphere, for example, the decomposition of the carboxylic acid radicals generates carbon monoxide and hydrogen, and the inside of the reactor becomes a reducing atmosphere, so a nickel powder with almost no oxidation is obtained.

The metal powder obtained with the method of the present invention consists of spherical primary particles of uniform size and with no aggregation. Also, the crystallinity is good, there are few defects inside the particles, and substantially no grain boundaries are included. This means that activity is low even though the powder is very fine. In particular, even readily oxidizable metals such as nickel, iron, cobalt, copper, and other such base metals or palladium can be stored stably in air because of their insusceptibility to oxidation, and this oxidation resistance is preserved even at high temperatures. Therefore, when the powder is used in a conductor paste for an internal or external conductor of a multilayer capacitor, there will be no increase in resistance due to the oxidation of the conductive metal, and no delamination, cracking or other such structural defects attributable to oxidation and reduction during firing, thereby allowing a capacitor with outstanding characteristics to be prepared.

If the melting point of the target metal or alloy is Tm° C., a spherical highly crystallized metal powder will not be obtained if the heating temperature is lower than $(Tm-200)°$ C. In particular, in order to obtain true-spherical single-crystal metal powder particles with a smooth surface, it is preferable for the heating to be performed at or above the melting point of the target metal or alloy. If oxides, nitrides, carbides, or the like are produced by this metal during or after the pyrolysis, then the heating must be performed under the conditions causing the decomposition of these oxides, nitrides, or carbides.

The present invention will now be described in specific terms through examples and comparative examples.

EXAMPLE 1

A powder of nickel acetate tetrahydrate was supplied to a jet mill at a feed rate of 5 kg/hr, and was pulverized and dispersed by nitrogen gas flowing at a rate of 200 liter/min. The thus obtained powder had an average particle size of 1.0 $\mu$m and a maximum particle size of 3.0 $\mu$m. The concentration of the nickel acetate tetrahydrate powder in the gas phase was 0.4 g/liter. At this powder concentration, the gas-solid mixture thus obtained was introduced into a reaction tube inside an electric furnace heated to 1550° C., where it was heated and decomposed, and the produced powder was collected using a bag filter.

The powder thus obtained was analyzed by an X-ray diffractometer, which revealed it to be a metallic nickel single-crystal powder. This powder was also observed under a scanning electron microscope(SEM), which revealed the powder to consist of true-spherical particles that were free from aggregation, with an average particle size of 0.5 $\mu$m and a maximum particle size of 2.0 $\mu$m. Thermogravimetric analysis was performed in air, but no oxidation occurred up to 350° C. A polycrystalline nickel powder with an average particle size of 0.5 $\mu$m obtained by a wet method has an oxidation temperature of 250° C., so it can be seen that the nickel powder of the present invention is a stable powder.

EXAMPLES 2 and 3

Nickel powders were prepared in the same manner as in Example 1, except that the temperature of the electric furnace was changed to 1300° C. and 1650° C., respectively. Table 1 shows the characteristics of the powders thus obtained.

EXAMPLE 4

A nickel powder was prepared in the same manner as in Example 1, except that the feed rate of the nickel acetate tetrahydrate powder into the jet mill was changed to 62.5 kg/hr., the nickel acetate tetrahydrate powder introduced into the reaction tube had an average particle size of about 2.5 $\mu$m and a maximum particle size of about 6.0 $\mu$m, and the nickel acetate tetrahydrate powder concentration in the gas phase was 5.0 g/liter. Table 1 shows the characteristics of the powder thus obtained.

EXAMPLES 5 and 6

Nickel powders were prepared in the same manner as in Example 1, except that nickel formate dihydrate powder and nickel oxalate dihydrate powder were used, respectively, in place of the nickel acetate tetrahydrate powder. Table 1 shows the characteristics of the powders thus obtained.

Comparative Example 1

A nickel powder was prepared in the same manner as in Example 1, except that the feed rate of the nickel acetate tetrahydrate powder into the jet mill was changed to 150 kg/hr., the nickel acetate tetrahydrate powder introduced into the reaction tube had an average particle size of about 5.0 $\mu$m, and the nickel acetate tetrahydrate powder concentration in the gas phase was 12.0 g/liter. The powder thus obtained was observed by SEM, which revealed that numerous particles of high crystallinity had fused together into huge particles of irregular shape, and the particle size distribution was wide.

Comparative Example 2

A nickel powder was prepared in the same manner as in Example 1, except that the temperature of the electric furnace was changed to 1100° C. The powder thus obtained had an irregular shape and had a wide particle size distribution, as shown in Table 1, and was an agglomerate of microcrystals, in which the crystallinity was low. Oxidation resistance was also low.

EXAMPLE 7

A nickel acetate tetrahydrate powder and a copper acetate powder were mixed in advance such that the weight ratio of the metal components was Ni:Cu=7:3, and a powder was prepared from this mixture by the same method as in Example 1.

The powder thus obtained was examined by X-ray diffraction, which revealed it to be a single-crystal nickel-copper alloy. Table 1 shows the characteristics.

EXAMPLE 8

A powder was prepared by the same method as in Example 1, except that a powder of palladium chloride was used as the raw material, the concentration of the powder dispersed in the gas phase was changed to 1.0 g/liter, air was used as the pulverization gas and the carrier gas, and the temperature of the electric furnace was changed to 1600° C.

The powder thus obtained was examined by X-ray diffraction, which revealed it to be a single-crystal powder of metallic palladium. Table 1 shows the characteristics.

EXAMPLE 9

A palladium chloride powder and a silver acetate powder were mixed in advance such that the weight ratio of the metal components was Pd:Ag=2:8, and a palladium-silver alloy single-crystal powder was prepared from this mixture by the same method as in Example 8, except that the concentration of the powder dispersed in the gas phase was changed to 0.4 g/liter and the temperature of the electric furnace was changed to 1400° C. Table 1 shows the characteristics.

Comparative Example 3

A powder was prepared by the same method as in Example 9, except that the temperature of the electric furnace was changed to 900° C. As shown in Table 1, the powder thus obtained was a mixture of a palladium oxide powder and a palladium-silver alloy powder with low crystallinity.

It can be seen from the results of Example 9 and Comparative Example 3 that oxidation resistance is far superior with the palladium-silver alloy powder obtained with the present invention.

TABLE 1

| | | | | Characteristics of produced powder | | | | | |
|---|---|---|---|---|---|---|---|---|---|
| | Raw material powder | Metal compound powder concentration (g/liter) | Heating temperature (° C.) | Composition | Average particle size ($\mu$m) | Maximum particle size ($\mu$m) | Oxidation commencement temp. (° C.) | Shape | Crystallinity |
| Example 1 | nickel acetate tetrahydrate | 0.4 | 1550 | Ni | 0.5 | 2.0 | 350 | true spherical | single crystal |
| Example 2 | nickel acetate tetrahydrate | 0.4 | 1300 | Ni | 0.6 | 2.0 | 330 | polyhedral spherical | highly crystallized |
| Example 3 | nickel acetate tetrahydrate | 0.4 | 1650 | Ni | 0.5 | 1.8 | 360 | true spherical | single crystal |
| Example 4 | nickel acetate tetrahydrate | 5.0 | 1550 | Ni | 1.5 | 3.5 | 400 | true spherical | single crystal |
| Example 5 | nickel formate dihyrate | 0.4 | 1550 | Ni | 0.8 | 2.2 | 340 | true spherical | single crystal |
| Example 6 | nickel oxalate dihydrate | 0.4 | 1550 | Ni | 0.4 | 1.3 | 320 | true spherical | single crystal |
| Comparative Example 1 | nickel acetate tetrahydrate | 12.0 | 1550 | Ni | $\geq$10 | Unmeasurable | 400 | irregular | highly crystallized |
| Comparative Example 2 | nickel acetate tetrahydrate | 0.4 | 1100 | Ni | 1.8 | 4.8 | 250 | irregular | micro crystalline |
| Example 7 | nickel acetate tetrahydrate, copper acetate | 0.4 | 1550 | Ni/Cu alloy | 0.6 | 2.0 | 330 | true spherical | single crystal |

TABLE 1-continued

| | Raw material powder | Metal compound powder concentration (g/liter) | Heating temperature (° C.) | Characteristics of produced powder | | | | | |
|---|---|---|---|---|---|---|---|---|---|
| | | | | Composition | Average particle size ($\mu$m) | Maximum particle size ($\mu$m) | Oxidation commencement temp. (° C.) | Shape | Crystallinity |
| Example 8 | palladium chloride | 1.0 | 1600 | Pd | 0.6 | 1.8 | 600 | true spherical | single crystal |
| Example 9 | palladium chloride, silver acetate | 0.4 | 1400 | Ag/Pd alloy | 0.6 | 1.3 | Not oxidized | true spherical | single crystal |
| Comparative Example 3 | palladium chloride, silver acetate | 0.4 | 900 | Ag/Pd alloy, PdO | 0.9 | 2.5 | 350 | irregular | microcrystalline |

In accordance with the method of the present invention, a metal powder that is spherical and has good crystallinity and good dispersiblity can be obtained with ease. Also, it is possible to obtain a single-crystal metal powder by heating the metal compound as a source material to a temperature at or above the melting point of the metal contained in the metal compound. Since no additives or solvents that would affect purity are used, a high-purity powder containing no impurities is obtained.

Furthermore, this method allows a metal powder to be obtained with a uniform particle size by controlling the particle size of the raw material powder, so adjusting the particle size is also easy. Therefore, there is no need for a classification step, and an extremely fine powder with a narrow particle size distribution that is suited to use in a thick film paste can be obtained.

Since the raw material is not in the form of a solution or suspension, there is less energy loss caused by solvent evaporation than with an ordinary spray pyrolysis method, allowing the powder to be prepared easily and at low cost. Furthermore, there is no problem with fusion of the droplets, and these droplets can be dispersed in the gas phase at a relatively high concentration, so efficiency is better.

In addition, since no oxidizing gas is generated from a solvent, this method is suited to the preparation of base metal powders that are prone to oxidation and require synthesis under a low oxygen partial pressure. Furthermore, if the compound is selected properly, oxidation can be minimized without requiring feeding a reducing gas from the outside, so the reaction conditions are easier to set. Finally, the obtained metal powder has a low activity and good oxidation resistance, and therefore, when it is used in a conductor paste for forming a conductor for a multilayer capacitor or the like, it is possible to prepare parts that have no delamination, cracks or other structural defects and are therefore highly reliable.

What is claimed is:
1. A method for preparing a highly crystallized metal powder, comprising:
  supplying at least one heat-decomposable solid metal compound powder into a reaction vessel using a carrier gas; and
  forming a metal powder by heating the solid metal compound powder in a state in which the solid metal compound powder is dispersed in a gas phase at a concentration of no more than 10 g/liter, at a temperature that is over the decomposition temperature of the metal compound powder and at least (Tm −200)° C. when the melting point of the metal contained in the metal compound powder is Tm° C.
2. The method for preparing a highly crystallized metal powder according to claim 1, wherein the solid metal compound powder is a homogeneous mixed powder or a composite powder of a metal compound or compounds including two or more metal elements, and the metal powder is an alloy powder.
3. The method for preparing a highly crystallized metal powder according to claim 1, wherein the carrier gas is an inert gas, and the metal powder is nickel powder, copper powder, or an alloy powder containing nickel and/or copper.
4. The method for preparing a highly crystallized metal powder according to claim 1, wherein a metal compound powder which brings the atmosphere during pyrolysis to a reducing atmosphere by being pyrolyzed in an inert gas is used as the metal compound powder.
5. The method for preparing a highly crystallized metal powder according to claim 4, wherein the metal compound powder is a metal carboxylate powder.
6. The method for preparing a highly crystallized metal powder according to claim 1, wherein the metal powder is a palladium powder or an alloy powder containing palladium.

* * * * *